US012631927B2

(12) United States Patent
Lee et al.

(10) Patent No.: US 12,631,927 B2
(45) Date of Patent: May 19, 2026

(54) LIGHT PATH CONTROL DEVICE AND DISPLAY DEVICE INCLUDING THE SAME

(71) Applicant: LG DISPLAY CO., LTD., Seoul (KR)

(72) Inventors: Semin Lee, Paju-si (KR); Jaejung Han, Paju-si (KR); Daeyong Kim, Paju-si (KR); Seungju Gwon, Paju-si (KR)

(73) Assignee: LG Display Co., Ltd (KR)

( * ) Notice: Subject to any disclaimer, the term of this patent is extended or adjusted under 35 U.S.C. 154(b) by 340 days.

(21) Appl. No.: 18/222,147

(22) Filed: Jul. 14, 2023

(65) Prior Publication Data

US 2024/0134240 A1     Apr. 25, 2024
US 2024/0231170 A9     Jul. 11, 2024

(30) Foreign Application Priority Data

Oct. 19, 2022     (KR) ........................ 10-2022-0135081

(51) Int. Cl.
G02F 1/157     (2006.01)
G02F 1/13     (2006.01)
H10K 59/80     (2023.01)

(52) U.S. Cl.
CPC ............ G02F 1/157 (2013.01); G02F 1/1323 (2013.01); H10K 59/879 (2023.02)

(58) Field of Classification Search
CPC ..... G02F 1/1323; G02F 1/15; G02F 1/133526
See application file for complete search history.

(56) References Cited

U.S. PATENT DOCUMENTS

| | | | |
|---|---|---|---|
| 2008/0002110 A1 | 1/2008 | Choi | |
| 2012/0013606 A1* | 1/2012 | Tsai ........................ | G02B 30/27 |
| | | | 359/462 |
| 2014/0153091 A1* | 6/2014 | Boudreau .............. | G02B 30/27 |
| | | | 156/99 |
| 2020/0249505 A1* | 8/2020 | Fang ................... | G02F 1/13363 |
| 2023/0047322 A1* | 2/2023 | Bourgin ................. | G02F 1/163 |

FOREIGN PATENT DOCUMENTS

| | | | | | |
|---|---|---|---|---|---|
| CN | 102540607 A | * | 7/2012 | | |
| CN | 104375336 A | * | 2/2015 | ............. | G02B 30/27 |
| KR | 100392041 B1 | | 7/2003 | | |
| KR | 20080043601 A | * | 5/2008 | .............. | G02B 3/00 |
| KR | 20150016608 A | | 2/2015 | | |
| KR | 10-2015-0108989 A | | 10/2015 | | |

(Continued)

OTHER PUBLICATIONS

Office Action in Korean Appln. No. 10-2022-0135081, mailed on Jul. 18, 2025, 17 pages (with English translation).

(Continued)

*Primary Examiner* — Alexander P Gross
(74) *Attorney, Agent, or Firm* — Fish & Richardson P.C.

(57) ABSTRACT

A light path control device includes a substrate, a viewing angle control member including light-shielding patterns patterned on the substrate at regular intervals, and a lens assembly that is formed on the viewing angle control member and includes a plurality of lenses, wherein the light-shielding patterns include electrochromic elements to implement a light-shielding mode or a light-transmitting mode, and a display device including the light path control device.

19 Claims, 19 Drawing Sheets

(56)     References Cited

FOREIGN PATENT DOCUMENTS

| KR | 20170026017 A | 3/2017 |
| KR | 20190013888 A | 2/2019 |
| KR | 20190066784 A | 6/2019 |
| KR | 10-2020-0049399 A | 5/2020 |
| KR | 20210086341 A | 7/2021 |
| KR | 10-2022-0033770 A | 3/2022 |
| KR | 20220096898 A | 7/2022 |

OTHER PUBLICATIONS

Office Action in Indian Appln. No. 202314046537, mailed on Nov. 28, 2025, 8 pages (with English translation).

* cited by examiner

LIGHT PATH CONTROL DEVICE AND DISPLAY DEVICE INCLUDING THE SAME

CROSS-REFERENCE TO RELATED APPLICATION

The present application claims the priority of Korean Patent Application No. 10-2022-0135081, filed on Oct. 19, 2022, which is hereby incorporated by reference in its entirety.

BACKGROUND

Field of the Disclosure

The present disclosure relates to a light path control device and a display device including the same.

Description of the Background

A light-shielding film may function as a light path control device that blocks light in a specific direction and transmits light in another specific direction by controlling the movement path of light according to the incident angle of outside light. Such a light-shielding film is attached to a display device used for a mobile phone, a notebook, a tablet PC, a vehicle navigation device, or the like, so that the light-shielding film may adjust a viewing angle of light when images are output from the display device or implement a clear image quality at a specific viewing angle.

Such a light-shielding film has a problem in that the luminance of a device to which the light-shielding film is attached may be reduced.

SUMMARY

Accordingly, the present disclosure is directed to a light path control device and a display device including the same that substantially obviate one or more of problems due to limitations and disadvantages described above.

More specifically, the present disclosure is to provide a light path control device including a viewing angle control member and a lens assembly to adjust a viewing angle and improve luminance at the same time, and to a display device including the same.

The disclosure relates to a light path control device applicable to both a liquid crystal display (LCD) and an organic light emitting diodes (OLEDs) display device, and a display device including the same.

A light path control device according to an aspect includes a substrate, a viewing angle control member including light-shielding patterns patterned on the substrate at regular intervals, and a lens assembly that is formed on the viewing angle control member and includes a plurality of lenses, wherein the light-shielding patterns may include electrochromic elements to implement a light-shielding mode or a light-transmitting mode.

The viewing angle control member may include a pattern cover layer that covers the light-shielding patterns.

The lens assembly may include a lens cover layer that has a refractive index lower than that of the plurality of lenses and covers the plurality of lenses.

Each of the electrochromic elements may include a first electrode, a second electrode disposed on the first electrode, and a color-changing layer that is interposed between the first electrode and the second electrode and includes an electrochromic material.

The first electrode may include patterns extending in one direction spaced apart from each other on the substrate, the color-changing layer and the second electrode may have the same shape as a shape of the first electrode and may be disposed overlapping the first electrode.

The first electrode may be formed in a form of a surface electrode on the substrate, the color-changing layer and the second electrode may include patterns extending in one direction spaced apart from each other on the substrate.

The first electrode, the color-changing layer, and the second electrode may be formed widely from a central area to an edge area, and the first electrode and the second electrode may be configured to receive voltage at the edge area.

The first electrode may be formed widely from a central area to an edge area, the color-changing layer and the second electrode may be formed only in the central area, so that the first electrode may be exposed upward in the edge area on at least one side.

The first electrode may include patterns extending in one direction spaced apart from each other on the substrate, the patterns may be connected to each other in at least one edge area.

Each of the plurality of lenses is a semi-cylindrical or spherical lens.

Each of the plurality of lenses may be aligned at intervals between the light-shielding patterns.

A display device according to an aspect includes a display panel that displays an image through a display area in which pixels are arranged, and a light path control device that is controlled to operate in a light-transmitting mode or a light-shielding mode in response to a share mode or private mode of the display panel, and the light path control device includes a substrate, a viewing angle control member including light-shielding patterns patterned on the substrate at regular intervals, and a lens assembly that is formed on the viewing angle control member and includes a plurality of lenses, wherein the light-shielding patterns may include electrochromic elements.

The display device may further include a backlight unit that is disposed under the light path control device and emits light, the display panel may be a liquid crystal display (LCD) disposed on an upper portion of the light path control device.

An air gap may be formed between the light path control device and the display panel.

The display device may include a lens cover layer that has a refractive index lower than that of the plurality of lenses and covers the plurality of lenses.

The light path control device and the display panel may be in direct contact with each other.

The display device may further include a backlight unit that is disposed under the light path control device and emits light, the display panel may be a liquid crystal display interposed between the light path control device and the backlight unit.

The display panel may be an organic light emitting diode (OLED) display panel disposed under the light path control device.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure. In the drawings.

DETAILED DESCRIPTION

Figure 1:
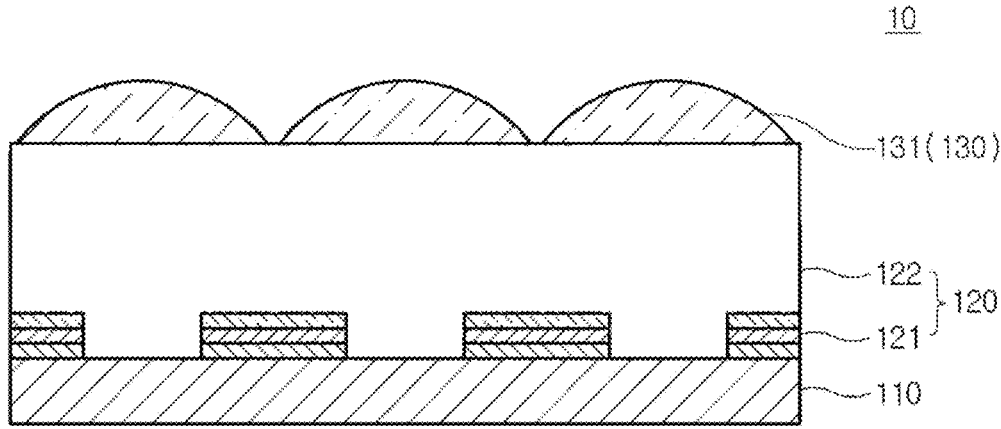
FIG. 1 is a cross-sectional view of a light path control device according to an aspect of the present disclosure.

Hereinafter, aspects of the present disclosure will be described with reference to the accompanying drawings. In this specification, when a component (or an area, layer, or portion, etc.) is referred to as being "on," "connected to," or "coupled to" another component, it means that the component may be directly connected/coupled to other components or that a third component may be disposed therebetween.

Like reference numerals refer to like elements. In addition, in the drawings, the thicknesses, proportions, and dimensions of components are exaggerated for effective description of technical content. "and/or" includes any combination of one or more that the associated configurations may define.

Terms such as first and second, etc., may be used to describe various elements, but the elements are not limited to the terms. The above terms are used only for the purpose of distinguishing one component from another component. For example, without departing from the scope of the present disclosure, the first component may be referred to as the second component. Similarly, the second component may also be referred to as the first component. A singular expression includes a plural expression unless the context clearly dictates otherwise.

Terms such as "under," "at a lower side," "on," "at an upper side" are used to describe the relationship of the components illustrated in the drawings. The above terms have relative concepts and are described with reference to directions indicated in the drawings.

Terms such as "comprise" or "have" are intended to designate that a feature, number, step, operation, component, part, or combination thereof described in the specification is present, and it should be understood that the terms do not preclude the possibility of addition or existence of one or more other features or numbers, steps, operations, components, parts, or combinations thereof.

FIG. 1 is a cross-sectional view of a light path control device according to an aspect.

Referring to FIG. 1, a light path control device 10 includes a substrate 110, a viewing angle control member 120 and a lens assembly 130.

The substrate 110 is a base substrate of the light path control device 10 and may be a light-transmitting substrate. The substrate 110 may be a rigid substrate including glass or tempered glass or a flexible substrate made of plastic. For example, the substrate 110 is a flexible polymer film, and may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI), and polystyrene (PS). However, the material of the substrate 110 is not limited thereto.

The viewing angle control member 120 may control a traveling direction of light incident to the light path control device 10 from a bottom. The viewing angle control member 120 may include light-shielding patterns 121 patterned on the substrate 110 at regular intervals.

The light-shielding patterns 121 are disposed on the substrate 110 at regular intervals. For example, the light-shielding patterns 121 may be arranged to be aligned with a pixel defining layer (bank) of a display panel to which the light path control device 10 is coupled, but the present aspect is not limited thereto.

The light-shielding pattern 121 is configured to dynamically block or transmit light to limit or open a viewing angle. For example, the light-shielding pattern 121 may be made of an electrochromic material that transmits or blocks outside light by becoming transparent or having a predetermined color through an oxidation/reduction reaction. A specific structure of the light-shielding pattern 121 will be described with reference to FIG. 3 below.

The viewing angle control member 120 may include a pattern cover layer 122 covering the light-shielding patterns 121. The pattern cover layer 122 may protect the light-shielding patterns 121 and eliminate a step caused by the light-shielding patterns 121 to flatten the upper surface of the viewing angle control member 120. The pattern cover layer 122 is a transparent material having high transmittance, and may be made of, for example, polyethylene terephthalate, polycarbonate, optical clear adhesive (OCA), photoresist resin, silicon oxide, or a combination of two or more thereof.

The lens assembly 130 may include a plurality of lenses 131. Each lens 131 in contact with the viewing angle control member 120 may be a semi-cylindrical or spherical lens. For example, a lower surface of each lens 131 may be a flat plane, and an upper surface of each lens 131 facing the viewing angle control member 120 may have a semicircular shape. The lenses 131 are disposed adjacent to each other. For example, the lens assembly 130 may include a lenticular lens as the plurality of lenses 131.

The lenses 131 are disposed to be aligned at intervals between the light-shielding patterns 121 of the viewing angle control member 120. For example, the lenses 131 may be disposed to be aligned with the pixels of the display panel to which the light path control device 10 is coupled, but the present aspect is not limited thereto.

The path of light incident to the substrate 110 of the light path control device 10 may be opened or blocked by the light-shielding patterns 121 of the viewing angle control member 120. When the light-shielding patterns 121 are in an open mode, a light path is open to both the front and side surfaces. The light may pass through the viewing angle control member 120 and reach the lens assembly 130. The light reaching the lens assembly 130 is condensed and dispersed by the lenses 131 and emitted to the front and side surfaces.

When the light-shielding patterns 121 are in a light-shielding mode, a light path is opened to the front surface through a gap between the light-shielding patterns 121 and blocked to the side surface by the light-shielding patterns 121. The light passing through the viewing angle control member 120 reaches the lens assembly 130. Since the lenses 131 of the lens assembly 130 are aligned at intervals of the light-shielding patterns 121, the light reaching the lens assembly 130 is condensed by the lenses 131 and emitted.

The light path control device 10 may implement a share mode in which a viewing angle is opened to both the front and side surfaces through the viewing angle control member 120 and a private mode in which the field of view is open for a certain viewing angle (e.g., the front surface) and the field of view is blocked for other viewing angles (e.g., the side surface). In addition, the light path control device 10 implements the share mode and the private mode, and at the same time, disperses, condenses, and emits light through the lens assembly 130, thereby improving overall luminance in the share mode and front luminance in the private mode.

In the following aspects, the side viewing angle may refer to an edge viewing angle including the entire circumference of the light path control device 10, except for the front viewing angle. For example, when the light path control device 10 is implemented in a rectangular shape, the side view angle includes not only left and right sides of the light path control device but also upper and lower sides of the light path control device. The light path control device 10 according to the above aspect includes the viewing angle control member 120 and the lens assembly 130 to improve front luminance while controlling not only the left and right side viewing angles but also the upper and lower side viewing angles.

Figure 2:
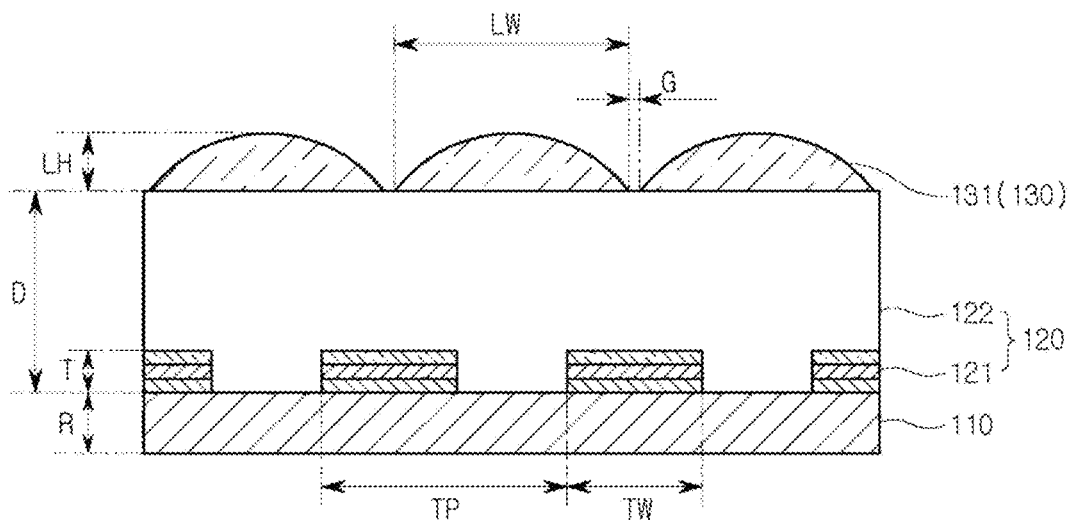
FIG. 2 is a cross-sectional view illustrating numerical values of components of the light path control device illustrated in FIG. 1.

FIG. 2 is a cross-sectional view illustrating numerical values of components of the light path control device illustrated in FIG. 1.

Referring to FIG. 2, the light-shielding pattern 121 of the viewing angle control member 120 may have a width TW of about 40 μm or less, or about 20 μm. One light-shielding pattern 121 and one interval may have a width TP of about 80 μm or less, or about 40 μm. A thickness T of the light-shielding pattern 121 may be about 1.5 μm. The transmittance of the light-shielding pattern 121 may be about 35% in a light-shielding mode and about 1% in a light-transmitting mode.

The thickness D of the pattern cover layer 122 may be about 90 μm or less, or 35 μm.

The lens assembly 130 may be configured such that 1.6 lenses 131 are disposed per 1 coat. The lens 131 of the lens assembly 130 may have a width LW of about 76 μm or less, or about 40 μm. The distance G between adjacent lenses 131 may be about 4 μm or less, or 0 μm. The thickness LH of the lens 131 may be about 10 μm or less, or 7.6 μm.

The thickness R of the substrate 110 may be about 80 μm or less, or 40 μm.

Numerical values of each component of the light path control device 10 are not limited to those described above. Depending on aspects, the width and thickness of each component may be varied.

Figure 3:
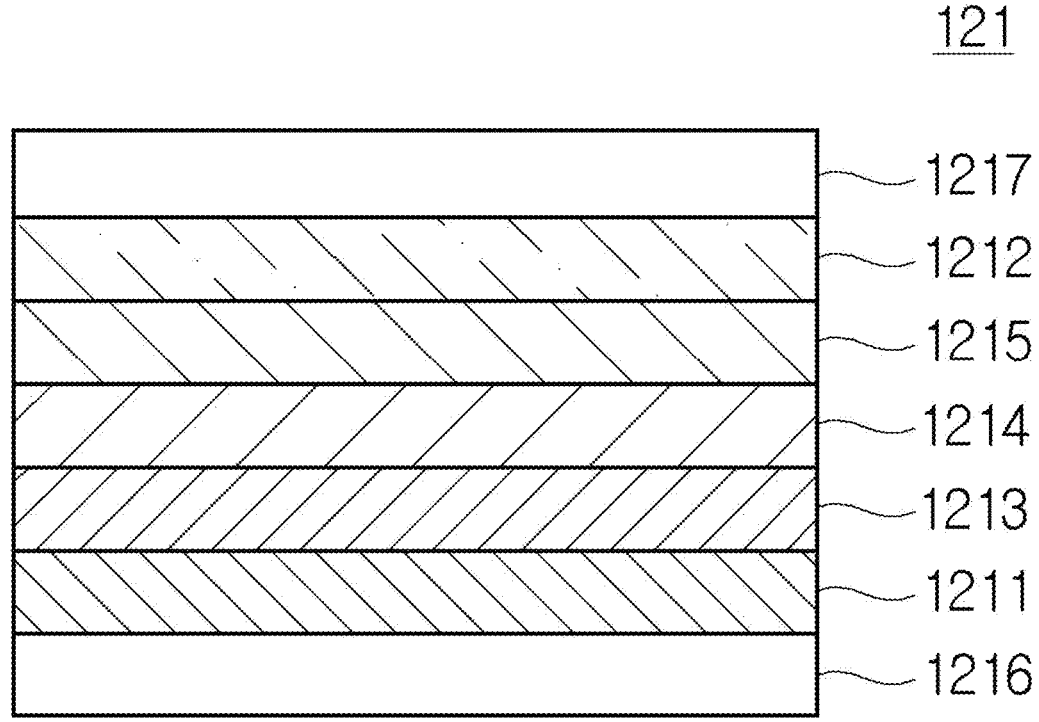
FIG. 3 is a cross-sectional view illustrating a structure of a light shielding pattern in more detail.

FIG. 3 is a cross-sectional view illustrating a structure of a light-shielding pattern in more detail.

In one aspect, the light-shielding pattern 121 is composed of an electrochromic element. Referring to FIG. 3, the light-shielding pattern 121 includes a first electrode 1211, a second electrode 1212, a color-changing layer 1213 interposed between the first electrode 1211 and the second electrode 1212, an ion conductive layer 1214, and an ion storage layer 1215.

The first electrode 1211 may be made of a transparent conductive material. For example, the first electrode 1211 may include indium tin oxide (ITO), indium zinc oxide (IZO), copper oxide, tin oxide, zinc oxide (ZnO), titanium oxide, or the like. In one aspect, the light transmittance of the first electrode 1211 may be about 80% or more.

The second electrode 1212 may be made of a transparent conductive material. The second electrode 1212 may be made of the same or similar material as the first electrode 1211.

The second electrode 1211 is disposed overlapping the first electrode 1212.

Accordingly, when a voltage is applied to the first electrode 1211 and the second electrode 1212, an electric field may be formed between them.

The color-changing layer 1213 may include an electrochromic material whose color is reversibly changed while being oxidized or reduced according to a voltage applied to the first electrode 1211 and the second electrode 1212. For example, when a voltage is applied to the first electrode 1211 and the second electrode 1212, the electrochromic material may change to a predetermined color such as black or blue by a reduction reaction. Conversely, when voltage is not applied to the first electrode 1211 and the second electrode 1212, the electrochromic material may become transparent due to an oxidation reaction. Or, vice versa is also possible.

For example, $WO_3$, $NiOxHy$, $Nb_2O_5$, $TiO_2$, $MoO_3$, $V_2O_5$, etc. may be used as inorganic electrochromic materials, and polymers containing repeating units derived from thiophene, carbazole, phenylene vinylene, acetylene, aniline, phenylenediamine, pyrrole monomers or the like, viologen derivatives, phenothiazine, tetrathiafulvalene, or the like may be used. The electrochromic material may be a material that changes from transparent to black or from black to transparent. When it is difficult to implement black with the electrochromic material, chromatic colors or black may be implemented with a combination of cyan, yellow, and magenta, or a combination of red, green, and blue.

An ion conductive layer 1214 is interposed between the color-changing layer 1213 and an ion storage layer 1215. The ion conductive layer 1214 is a solid electrolyte layer, and may conduct ions so that the electrochromic material undergoes an oxidation or reduction reaction according to a change in voltage. The polymer constituting the ion conductive layer 1214 may be poly(vinylidene fluoride-co-hexafluoropropylene)(PVDF-HFP), polyacrylonitrile (PAN), poly(methyl methacrylate)(PMMA), poly(2-acrylamido-2-methyl-1-propanesulfonic acid)(Poly-AMPS), modified polyethylene oxide (modified PEO), or the like.

The ion storage layer 1215 is interposed between the ion conductive layer 1214 and the second electrode 1212. The ion storage layer 1215 stores ions to be used in an oxidation or reduction reaction, and may be electrically connected to the second electrode 1212. The ion storage layer 1215 may be made of a metal oxide selected from a group consisting of cerium oxide (CeO2), titanium oxide (TiO2), tungsten oxide (WO3), nickel oxide (NiO), molybdenum oxide (MoO3), vanadium oxide (V2O5), and combinations thereof.

In an aspect, when a voltage is applied to the first electrode 1211 and the second electrode 1212, an electric field is formed between the first electrode 1211 and the second electrode 1212. Then, ions in the ion conductive layer 1214 move to the color-changing layer 1213. The color-changing layer 1213 may be oxidized (or reduced) to a magnitude according to the concentration of the moved ions, and the transparency may change.

According to an aspect, the light-shielding pattern 121 may further include a planarization layer 1216 formed on the lower surface of the first electrode 1211 and a protective layer 1217 formed on the upper surface of the second electrode 1212. The planarization layer 1216 and the protective layer 1217 are provided to protect the electrochromic element from the outside. The planarization layer 1216 may be, for example, an encapsulation layer (or a planarization layer, or a protective layer) of a display panel to which the light path control device 10 is coupled, and may be provided to flatten the step caused by elements of the display panel. The protective layer 1217 may be composed of an oxide film, a barrier layer, or the like, but is not limited thereto.

Meanwhile, the structure of the light-shielding pattern 121 is not limited to the illustrated one. For example, the disposition of the color-changing layer 1213, the ion conductive layer 1214, and the ion storage layer 1215 between the first electrode 1211 and the second electrode 1212 may be variously changed.

Figure 4A:
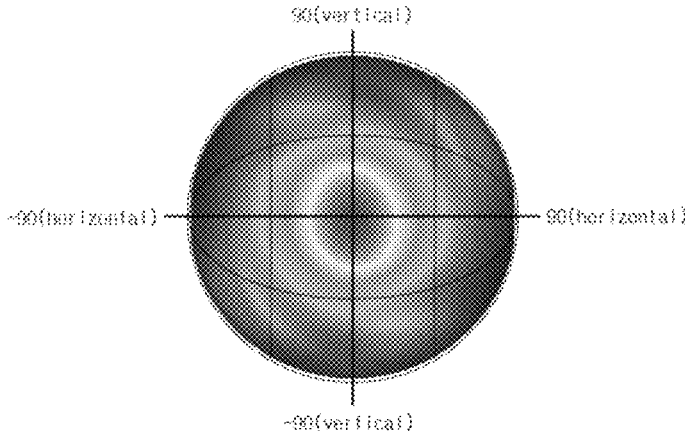
FIGS. 4A and 4B are simulation results of measuring luminance distribution in share and private modes of the light path control device illustrated in FIG. 1.
Figure 4B:
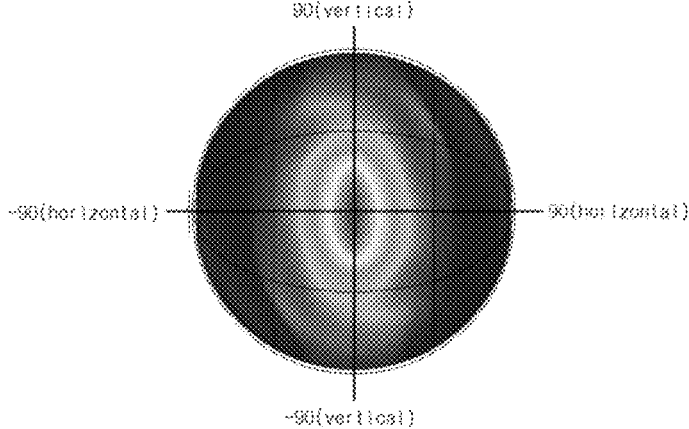

FIGS. 4A and 4B are simulation results of measuring luminance distribution in share and private modes of the light path control device illustrated in FIG. 1.

When a backlight unit 20 (shown in FIG. 5) is placed under the light path control device 10, the light emitted from the backlight unit 20 is incident to the light path control device 10.

When the viewing angle control member 120 is in a light-transmitting mode, the incident light is emitted in the front direction and side direction of the viewing angle control member 120, and as illustrated in FIG. 4A, the emitted light has high luminance not only in the front direction but also in the lateral direction by the lens assembly 130. In this share mode, since the side viewing angle is open, light may be viewable by a user watching from the side surface.

When the viewing angle control member 120 is in the light-shielding mode, an emission angle of incident light is limited to the front direction. As illustrated in FIG. 4B, through the lens assembly 130, the emitted light has high luminance in the front direction, and the light emission is restricted in the side direction. In this private mode, since the side viewing angle is limited, light is not viewable by a user watching from the side surface.

As illustrated in FIG. 4B, the viewing angle control member 120 may block viewing angles for all of the upper, lower, left, and right sides in the side direction.

Figure 5:
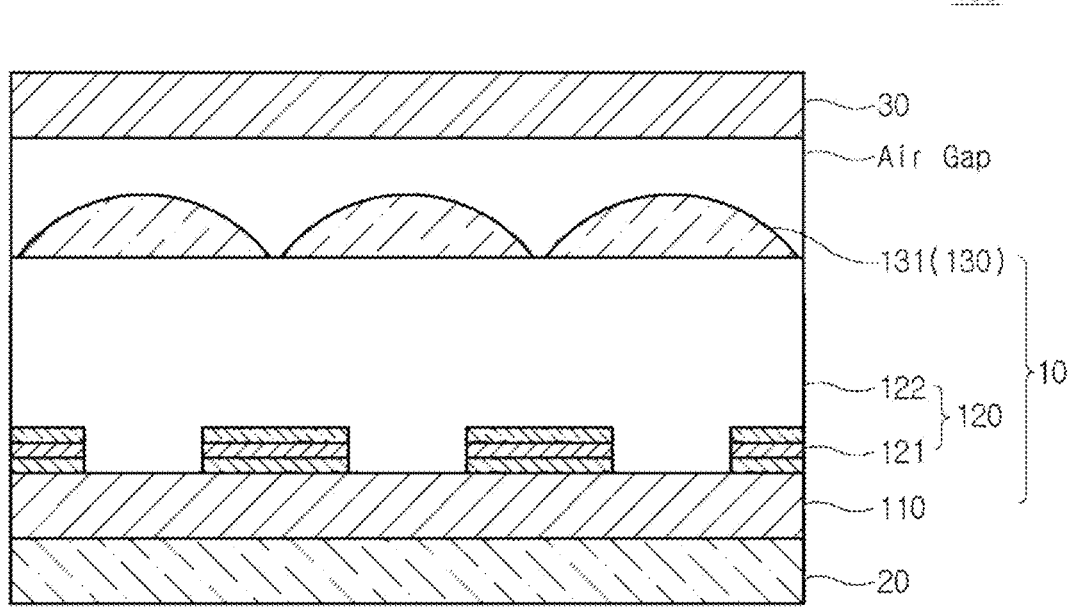
FIG. 5 is a cross-sectional view of a display device including a light path control device according to a first aspect of the present disclosure.

FIG. 5 is a cross-sectional view of a display device including a light path control device according to a first aspect.

Referring to FIG. 5, a display device 100 according to a first aspect includes the light path control device 10, the backlight unit 20 and a display panel 30.

The light path control device 10 operates in the light-transmitting mode or the light-shielding mode in response to the share mode or private mode of the display panel 30, respectively. The mode of the light path control device 10 may be controlled by applying or not applying voltage. Since the light path control device 10 is the same as that illustrated in FIGS. 1 to 4, detailed description thereof will be omitted.

The backlight unit 20 may be placed under the light path control device 10 to provide light toward the light path control device 10. The backlight unit 20 may include a light source for generating light having an arbitrary wavelength and a light guide plate for guiding the light generated from the light source toward the light path control device 10.

The display panel 30 is placed above the light path control device 10. The display panel 30 is configured to display an image by including a display area in which pixels are disposed. In the first aspect, the display device 100 is an LCD in which the display panel 30 includes a liquid crystal layer.

In the first aspect, the light path control device 10 and the display panel 30 are spaced apart at regular intervals, and a predetermined air gap may be formed between the light path control device 10 and the display panel 30.

Figure 6:
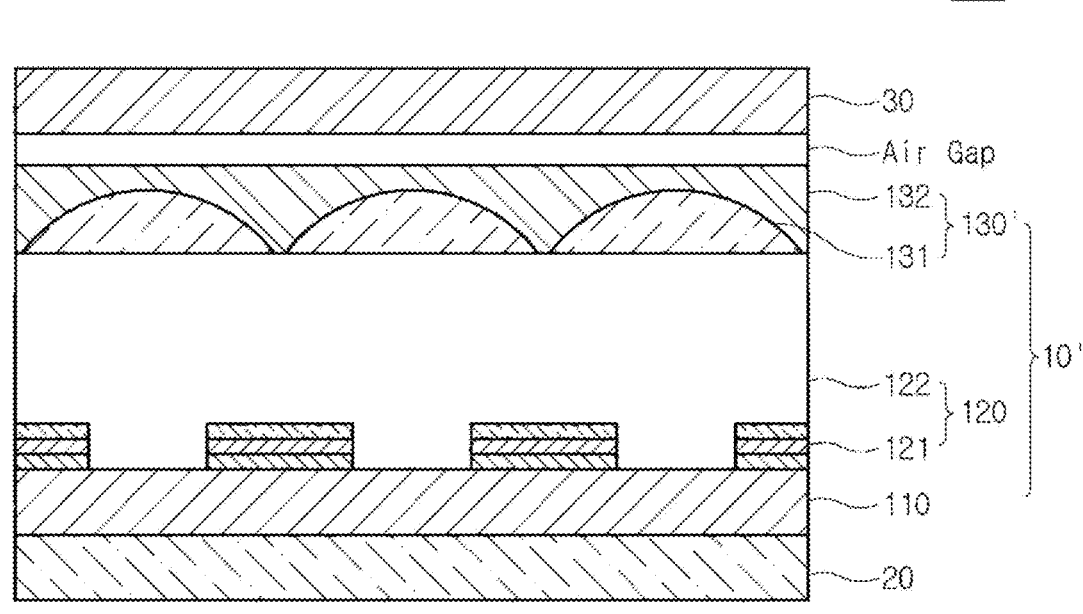
FIG. 6 is a cross-sectional view of a display device including a light path control device according to a second aspect of the present disclosure.

FIG. 6 is a cross-sectional view of a display device including a light path control device according to a second aspect.

Referring to FIG. 6, a display device 200 according to a second aspect includes a light path control device 10', the backlight unit 20, and the display panel 30.

Compared to the light path control device 10 described with reference to FIGS. 1 to 4, the light path control device 10' according to the present aspect is further provided with a lens cover layer 132 of the lens assembly 130'.

The lens cover layer 132 may prevent damage to the lenses 131 due to external impact. The lens cover layer 132 may completely cover the semicircular surfaces of the lenses 131. The lens cover layer 132 may flatten the upper surface of the lens assembly 130' by eliminating the step difference caused by the lenses 131.

The lens cover layer 132 may include an insulating material. The lens cover layer 132 may have a smaller refractive index than that of the lens 131. In this aspect, the lens 131 may be made of high refractive index resin, and the lens cover layer 132 may be made of low refractive index resin. Then, light incident from the backlight unit 20 to the light path control device 10' may be effectively condensed through the lens assembly 130'.

The backlight unit 20 may be placed under the light path control device 10' to provide light toward the light path control device 10'. The backlight unit 20 may include a light source for generating light having an arbitrary wavelength and a light guide plate for guiding the light generated from the light source toward the light path control device 10'.

The display panel 30 is placed above the light path control device 10'. The display panel 30 is configured to display an image by including a display area in which pixels are disposed. In the second aspect, the display device 200 is an LCD in which the display panel 30 includes a liquid crystal layer.

In the second aspect, the light path control device 10' and the display panel 30 are spaced apart at regular intervals, and a predetermined air gap may be formed between the light path control device 10' and the display panel 30.

Figure 7:
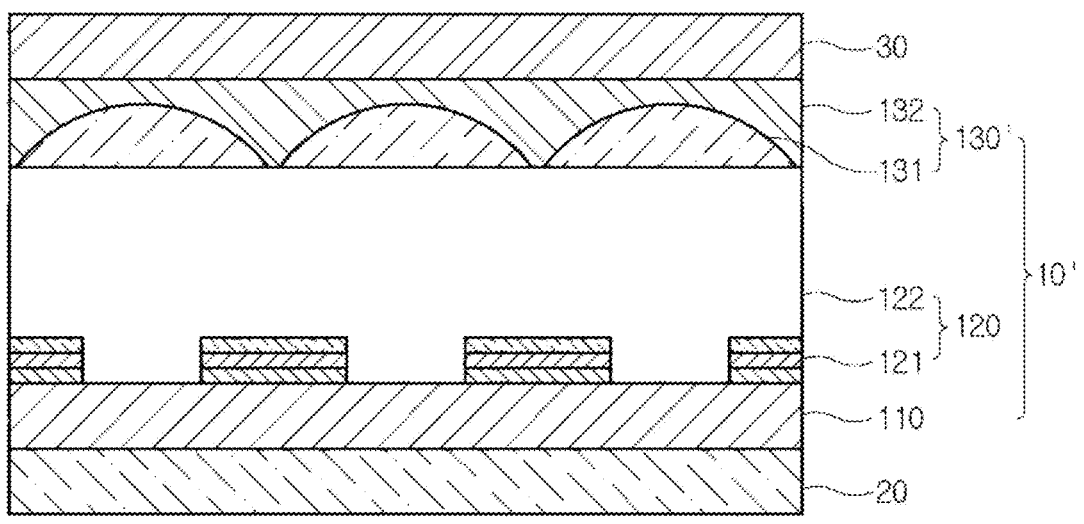
FIG. 7 is a cross-sectional view of a display device including a light path control device according to a third aspect of the present disclosure.

FIG. 7 is a cross-sectional view of a display device including a light path control device according to a third aspect.

Referring to FIG. 7, a display device 300 according to a third aspect includes the light path control device 10', the backlight unit 20, and the display panel 30.

Since the light path control device 10' is the same as that illustrated in FIGS. 1 to 4, a detailed description thereof will be omitted.

The backlight unit 20 may be placed under the light path control device 10' to provide light toward the light path control device 10'. The backlight unit 20 may include a light source for generating light having an arbitrary wavelength and a light guide plate for guiding the light generated from the light source toward the light path control device 10'.

The display panel 30 is placed above the light path control device 10'. The display panel 30 is configured to display an image by including a display area in which pixels are disposed. In the third aspect, the display device 300 is an LCD in which the display panel 30 includes a liquid crystal layer.

In the third aspect, the light path control device 10' and the display panel 30 are in direct contact, and no air gap is formed between them. In this aspect, the pattern cover layer 122 may have the same refractive index as the refractive index between an encapsulation layer covering the upper portion of the display panel 30 and the lens 131 or the refractive index of the encapsulation layer. Accordingly, loss of light due to a rapid change in refractive index between the display panel 30 and the lens assembly 130' may be minimized.

Figure 8:
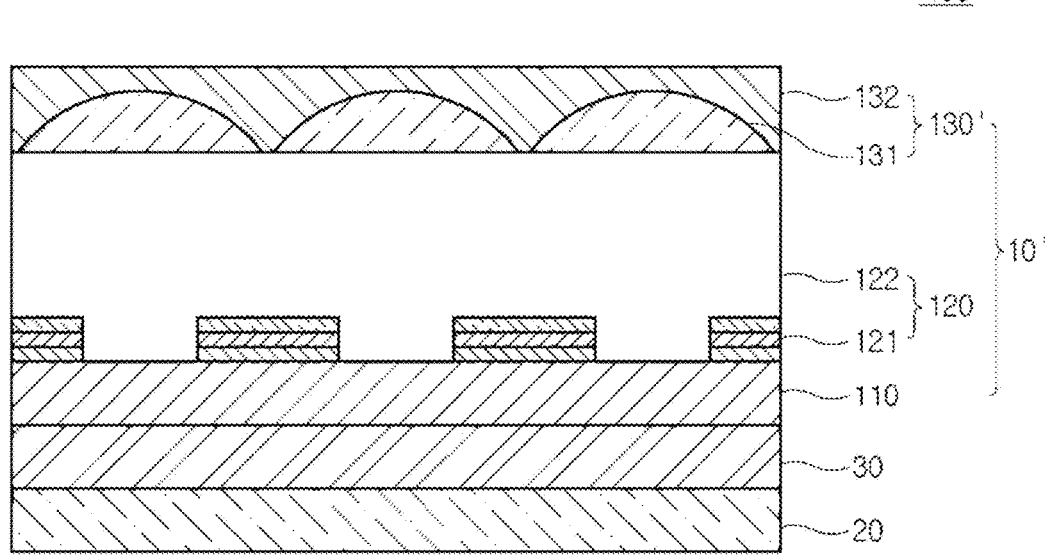
FIG. 8 is a cross-sectional view of a display device including a light path control device according to a fourth aspect of the present disclosure.

FIG. 8 is a cross-sectional view of a display device including a light path control device according to a fourth aspect.

Referring to FIG. 8, in a display device 400 according to a fourth aspect, the display panel 30 is disposed between the backlight unit 20 and the light path control device 10', compared to the first aspect illustrated in FIG. 5.

In this aspect, light emitted from the backlight unit 20 is applied to the display panel 30, and the light emitted from pixels of the display panel 30 passes upward through the light path control device 10'. In this case, the side viewing angle of the image displayed on the display panel 30 may be opened or limited through mode control of the light path control device 10'.

Figure 9:
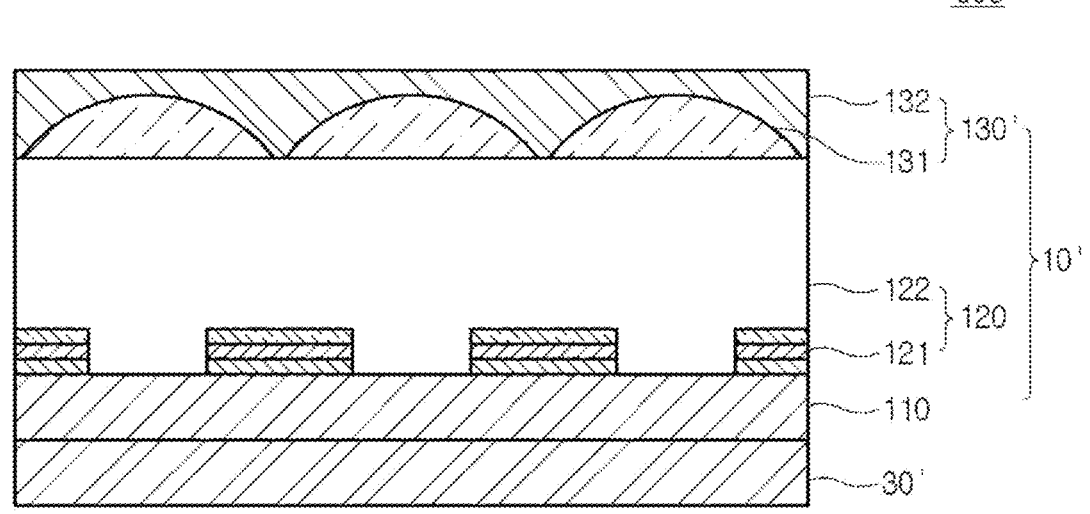
FIG. 9 is a cross-sectional view of a display device including a light path control device according to a fifth aspect of the present disclosure.

FIG. 9 is a cross-sectional view of a display device including a light path control device according to a fifth aspect.

Referring to FIG. 9, in a display device 500 according to a fifth aspect, the display panel 30' is composed of an OLED including an organic light emitting element, compared to the first aspect illustrated in FIG. 5. In this aspect, the display device 500 does not include a separate backlight unit, and may include the display panel 30' and the light path control device 10' disposed on the display panel 30'.

The light emitted from the organic light emitting element of the display panel 30' is emitted upward via the light path control device 10'. In this case, the side viewing angle of the image displayed on the display panel 30' may be opened or limited through mode control of the light path control device 10'.

As illustrated in FIGS. 5 to 9, the light path control devices 10 and 10' according to an aspect may be applied to both LCD and OLED, and may have the same viewing angle control and luminance enhancement effect.

Figure 10:
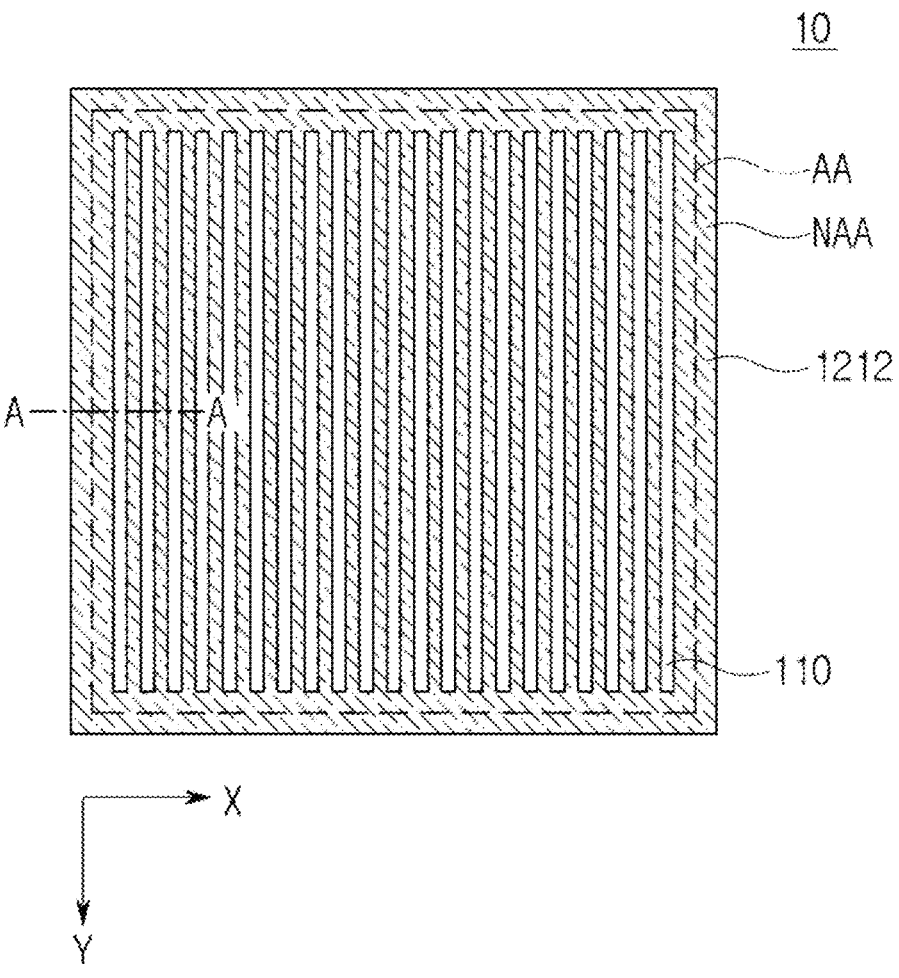
FIG. 10 is a plan view of a viewing angle control member according to a first aspect of the present disclosure.
Figure 11:
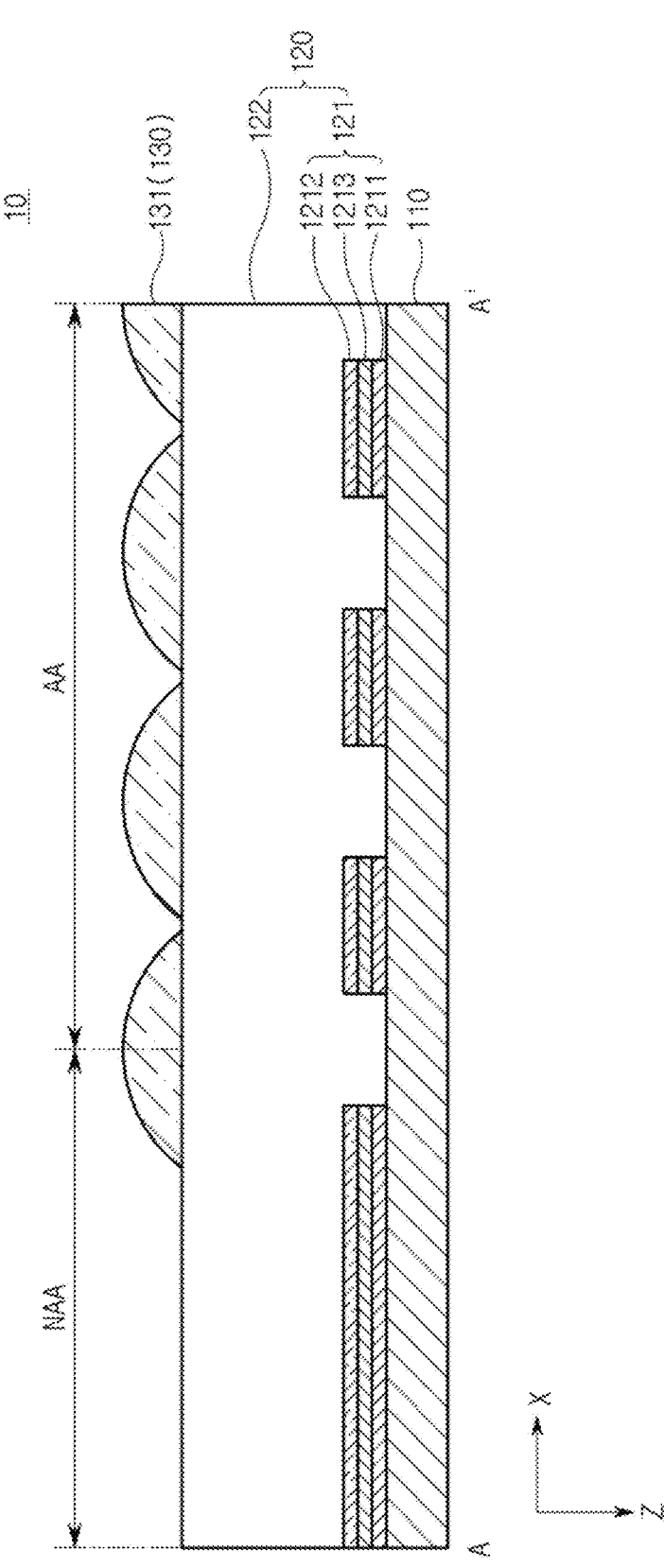
FIG. 11 is a cross-sectional view taken along line A-A' in FIG. 10.

FIG. 10 is a plan view of a viewing angle control member according to a first aspect. FIG. 11 is a cross-sectional view taken along the line A-A' in FIG. 10. In FIG. 10, illustration of the lens assembly 130 is omitted for convenience of description.

Referring to FIGS. 10 and 11, the viewing angle control member 120 according to the first aspect includes the first electrode 1211, the second electrode 1212, and the color-changing layer 1213 interposed between the first electrode 1211 and the second electrode 1212. The ion conductive layer 1214 and the ion storage layer 1215 described with reference to FIG. 3 are omitted for convenience of description.

In the first aspect, the first electrode 1211 may be formed of patterns extending in one direction spaced apart from each other on a plane. The patterns of the first electrode 1211 may have, for example, a shape that is spaced apart at regular intervals along the first direction X on a plane and elongated along the second direction Y perpendicular to the first direction X. These patterns may be connected to each other in one area. For example, the display panel 30 may include a display area AA in which pixels are disposed and a non-display area NAA surrounding the display area AA, and the patterns may be connected to each other in an edge area corresponding to the non-display area NAA.

The second electrode 1212 is disposed on the first electrode 1211 with the color-changing layer 1213 interposed therebetween. The second electrode 1212 has the same shape as the first electrode 1211 and may be disposed to overlap the first electrode 1211 on a plane. Here, the color-changing layer 1213 also has the same shape as the first electrode 1211 and is disposed to overlap the first electrode 1211 on a plane.

In this aspect, since the first electrode 1211 and the second electrode 1212 are patterned to have regular intervals, transmittance of the light path control device 10 may be further improved.

The lens 131 of the lens assembly 130 has a semicircular cross section with respect to the first direction X on a plane. In addition, such a lens 131 may be formed to elongate along the second direction Y and have a square cross section with respect to the second direction Y.

Figure 12:
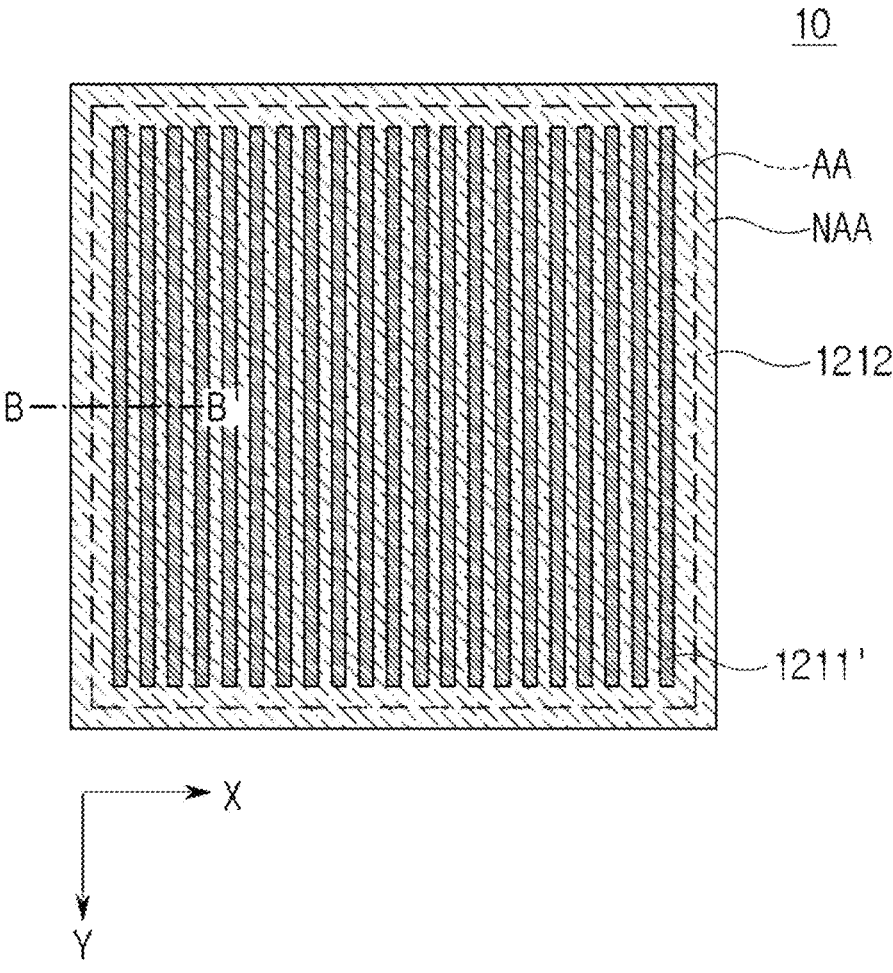
FIG. 12 is a plan view of a viewing angle control member according to a second aspect.
Figure 13:
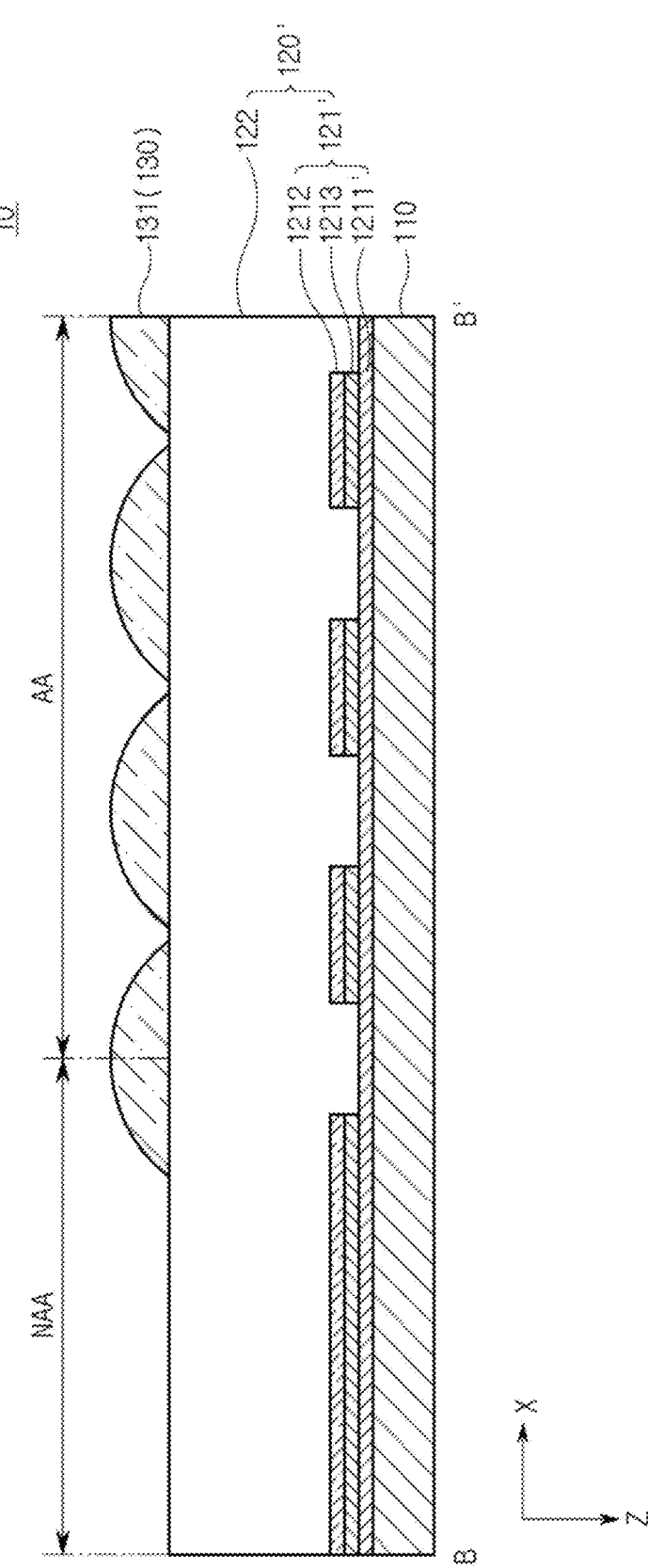
FIG. 13 is a cross-sectional view taken along the line B-B' in FIG. 12.

FIG. 12 is a plan view of a viewing angle control member according to a second aspect. FIG. 13 is a cross-sectional view taken along the line B-B' in FIG. 12. In FIG. 12, illustration of the lens assembly 130 is omitted for convenience of description.

Referring to FIGS. 12 and 13, a viewing angle control member 120' according to a second aspect includes a first electrode 1211', the second electrode 1212, and the color-changing layer 1213 interposed between the first electrode 1211' and the second electrode 1212. The ion conductive layer 1214 and the ion storage layer 1215 described with reference to FIG. 3 are omitted for convenience of description.

Compared to the first aspect, in the second aspect, the first electrode 1211' is configured in the form of a surface electrode. The first electrode 1211' may be formed widely from a central area corresponding to the display area AA to an edge area corresponding to the non-display area NAA in the display panel 30.

The second electrode 1212 and the color-changing layer 1213 may be formed of patterns extending in one direction apart from each other on a plane. The patterns of the second electrode 1212 may have, for example, a shape that is spaced at regular intervals along the first direction (X) on a plane and elongated along the second direction (Y) perpendicular to the first direction (X). These patterns may be connected to each other in one area. For example, the patterns may be connected to each other in an edge area corresponding to the non-display area NAA.

The second electrode 1212 is disposed on the first electrode 1211' with the color-changing layer 1213 interposed therebetween. Since the first electrode 1211' is widely disposed in the form of a planar electrode, the second electrode 1212 overlaps the first electrode 1211' on a plane.

In this aspect, the manufacturing process of the viewing angle control member 120' may be simplified, and the electric field between the first electrode 1211' and the second electrode 1212 may be increased to increase the color-changing rate and efficiency.

Figure 14:
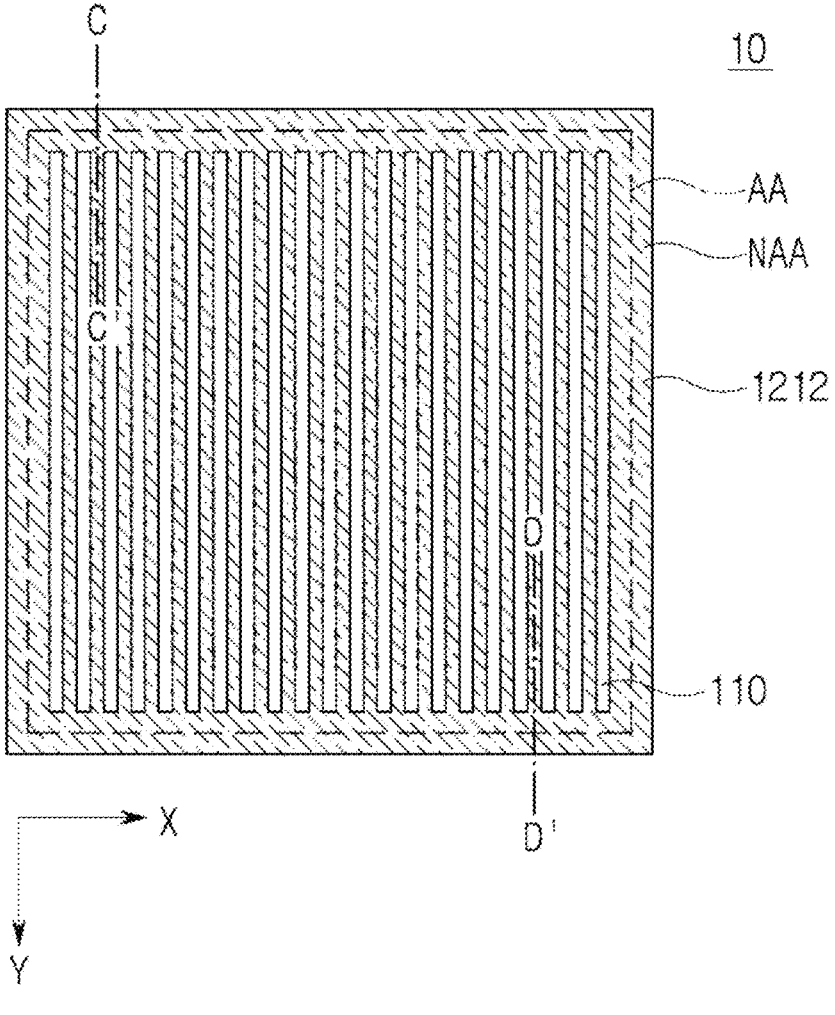
FIG. 14 is a plan view of a viewing angle control member according to a third aspect of the present disclosure.
Figure 15:
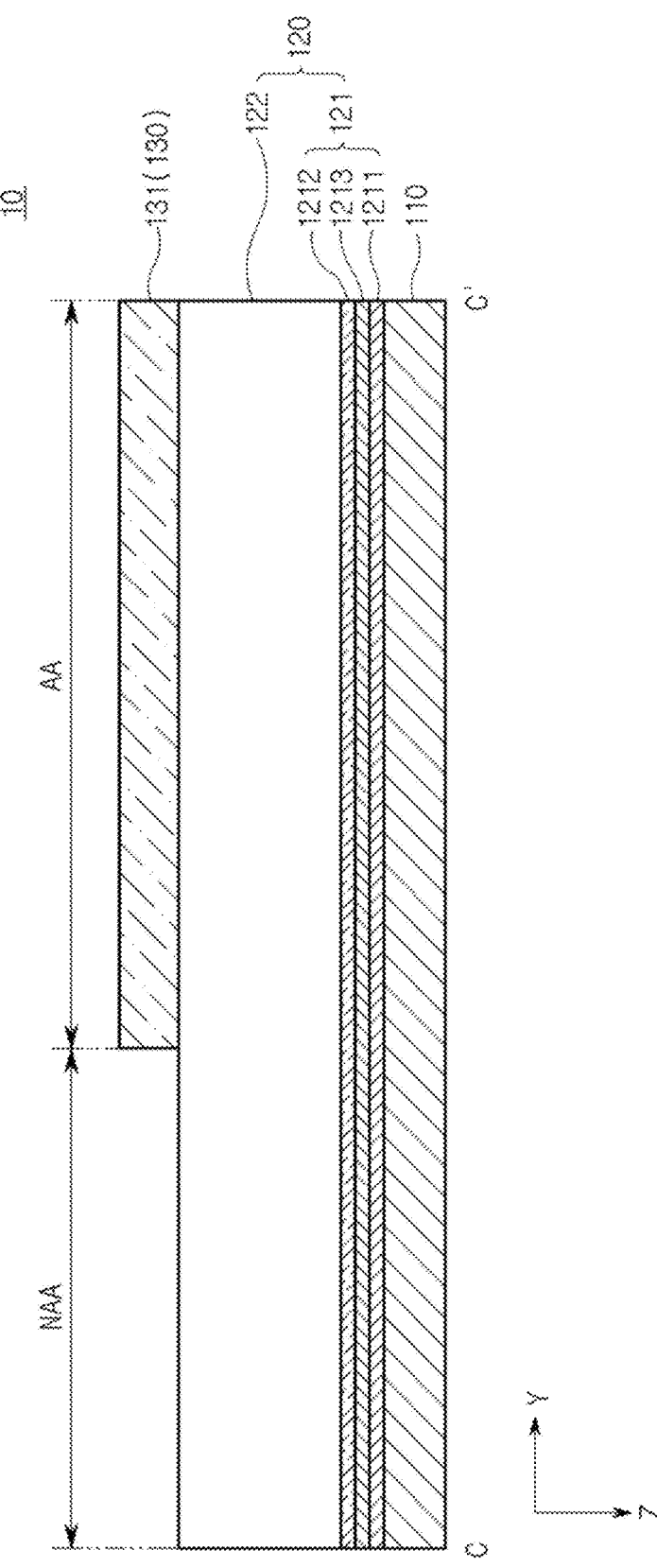
FIG. 15 is a cross-sectional view taken along line C-C' in FIG. 14.
Figure 16:
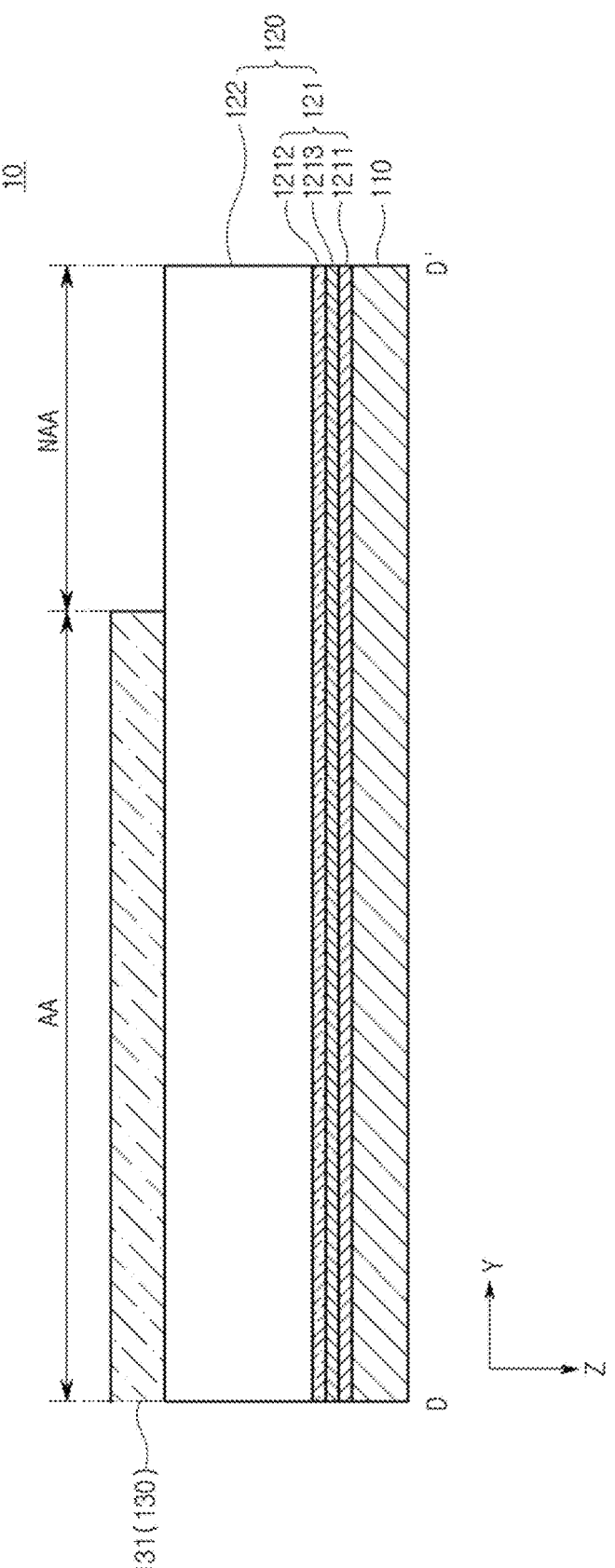
FIG. 16 is a cross-sectional view taken along line D-D' in FIG. 14.

FIG. 14 is a plan view of a viewing angle control member according to a third aspect. FIG. 15 is a cross-sectional view taken along line C-C' in FIG. 14. FIG. 16 is a cross-sectional view taken along the line D-D' in FIG. 14. In FIG. 14, illustration of the lens assembly 130 is omitted for convenience of description.

Referring to FIGS. 14 to 16, the viewing angle control member 120 according to a third aspect includes the first electrode 1211, the second electrode 1212, and the color-changing layer 1213 interposed between the first electrode 1211 and the second electrode 1212. The ion conductive layer 1214 and the ion storage layer 1215 described with reference to FIG. 3 are omitted for convenience of description.

In the third aspect, the patterns of the first electrode 1211, the patterns of the color-changing layer 1213, and the patterns of the second electrode 1212 are formed widely from a central area corresponding to the display area AA to an edge area corresponding to the non-display area NAA in the display panel 30.

The first electrode 1211 and the second electrode 1212 may be configured to receive voltage at the edge area. The voltage may be applied through the display panel 30 or a separate external voltage source.

The lens 131 of the lens assembly 130 has a semicircular cross section with respect to the first direction X on a plane. In addition, such a lens 131 may be formed to elongate along the second direction Y to have a square cross section with respect to the second direction Y.

Figure 17:
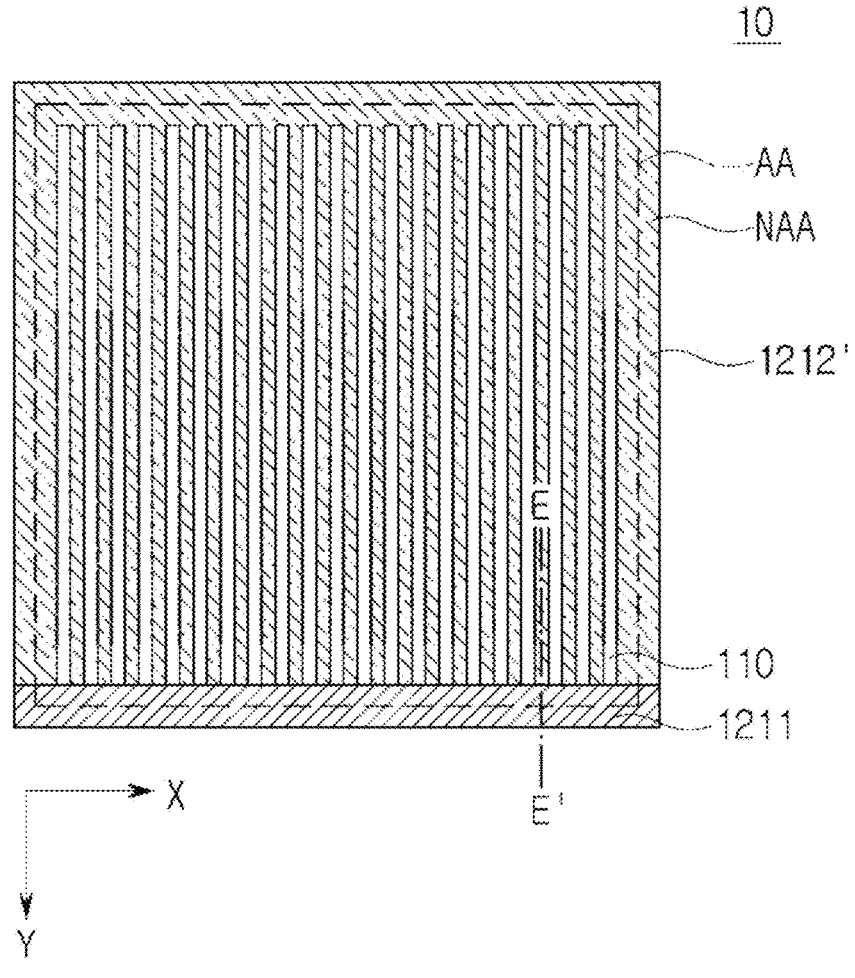
FIG. 17 is a plan view of a viewing angle control member according to a fourth aspect of the present disclosure.
Figure 18:
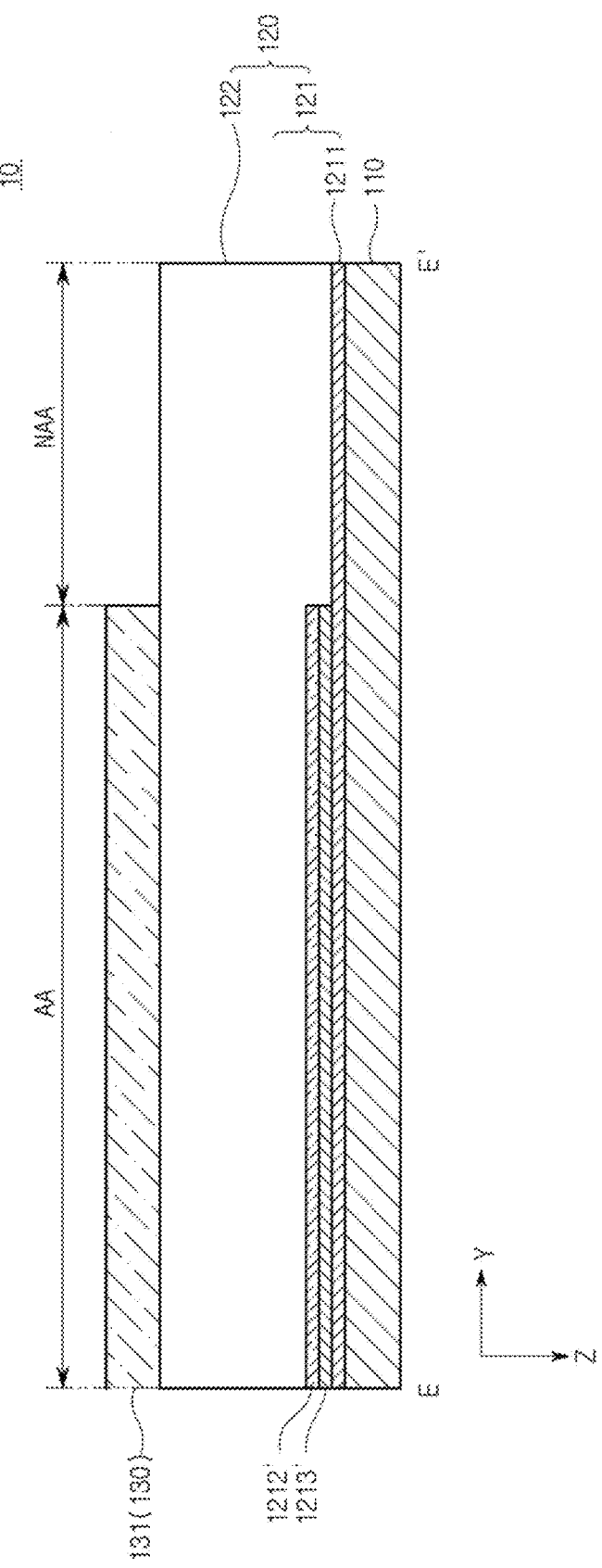
FIG. 18 is a cross-sectional view taken along line E-E' in FIG. 17.

FIG. 17 is a plan view of a viewing angle control member according to a fourth aspect. FIG. 18 is a cross-sectional view taken along the line E-E' in FIG. 17. In FIG. 17, illustration of the lens assembly 130 is omitted for convenience of description.

Referring to FIGS. 17 and 18, in the fourth aspect, the patterns of the first electrode 1211 are widely formed from a central area corresponding to the display area AA to an edge area corresponding to the non-display area NAA in the display panel 30. However, the color-changing layer 1213' and the second electrode 1212' are formed only in the central area corresponding to the display area AA and are not formed in the edge area corresponding to the non-display area NAA on at least one side of the edge area. Accordingly, the first electrode 1211 is exposed upward on at least one side of the edge area.

Compared to the third aspect, the fourth aspect has an advantage of minimizing an area required for electron spreading.

Figure 19:
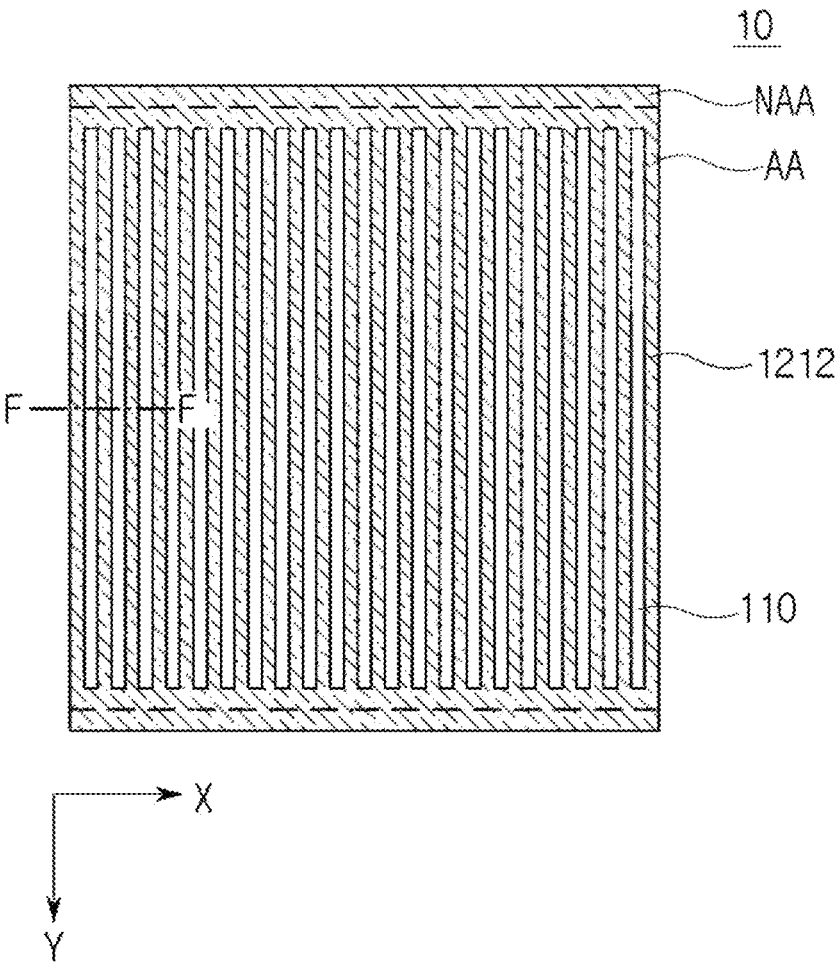
FIG. 19 is a plan view of a viewing angle control member according to a fifth aspect of the present disclosure.
Figure 20:
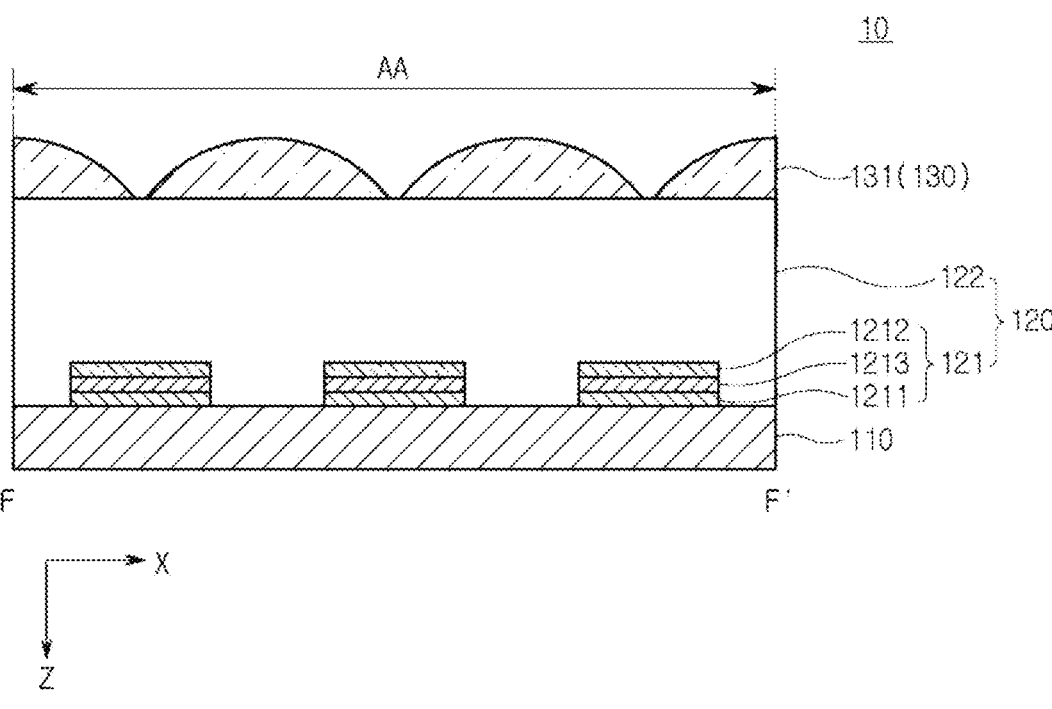
FIG. 20 is a cross-sectional view along line F-F' in FIG. 19.

FIG. 19 is a plan view of a viewing angle control member according to a fifth aspect. FIG. 20 is a cross-sectional view along the line F-F' in FIG. 19. In FIG. 19, illustration of the lens assembly 130 is omitted for convenience of explanation.

Referring to FIGS. 19 and 20, in a fifth aspect, the first electrode 1211 may be formed of patterns extending in one direction spaced apart from each other on a plane. The patterns of the first electrode 1211 may have, for example, a shape that is spaced apart at regular intervals along the first direction X on a plane and elongated along the second direction Y perpendicular to the first direction X.

These patterns may be connected to each other in one area. For example, the display panel 30 may include the display area AA in which pixels are disposed and the non-display area NAA surrounding the display area AA, and the patterns may be connected to each other in some of the edge areas corresponding to the non-display area NAA.

Compared to the first aspect, in the fifth aspect, the patterns of the first electrode 1211 are connected to each other at the upper and lower edge areas among the edge areas. In this aspect, the non-display area NAA may be removed from the left and right edge areas, and thus, the bezel area of the display device 500 may be minimized.

The second electrode 1212 is disposed on the first electrode 1211 with the color-changing layer 1213 therebetween. The second electrode 1212 has the same shape as the first electrode 1211 and may be disposed to overlap the first electrode 1211 on a plane.

The light path control device according to aspects and a display device including the same may implement the private mode and the share mode while maintaining or improving luminance efficiency.

The light path control device according to aspects and a display device including the same have an advantage of being applicable to both a liquid crystal display (LCD) and an organic light emitting diode (OLED) display device.

Although the aspects of the present disclosure have been described above with reference to the accompanying drawings, it will be understood that the technical configuration of the present disclosure may be embodied in other specific forms by those skilled in the art to which the present disclosure pertains without changing the technical spirit or essential features of the present disclosure. Therefore, it should be understood that the aspects described above are illustrative in all respects and not restrictive. In addition, the scope of the present disclosure is indicated by the claims to be described later rather than by the above detailed description. In addition, all changes or modifications derived from the meaning and scope of the claims and their equivalent concepts should be construed as being included in the scope of the present disclosure.

What is claimed is:

1. A light path control device, comprising:
   a substrate including a central area and an edge area adjacent to the central area;
   a viewing angle control member including light-shielding patterns patterned on the substrate at regular intervals and substantially arranged in the central area; and
   a lens assembly that is formed on the viewing angle control member and includes a plurality of lenses, wherein the light-shielding patterns include electrochromic elements to implement a light-shielding mode or a light-transmitting mode, the electrochromic elements comprise a plurality of electrode patterns spaced apart from each other, wherein the substrate has a plurality of sides, wherein the electrode patterns are connected to each other in the edge area adjacent to at least one first side of the plurality of sides, and wherein a first distance between the central area and the at least one first side is greater than a second distance between the central area and at least one second side, different from the at least one first side, of the plurality of sides.

2. The light path control device of claim 1, wherein the viewing angle control member includes a pattern cover layer that covers the light-shielding patterns.

3. The light path control device of claim 1, wherein the lens assembly includes a lens cover layer that has a refractive index lower than that of the plurality of lenses and covers the plurality of lenses.

4. The light path control device of claim 1, wherein each of the electrochromic elements includes:

a first electrode;

a second electrode disposed on the first electrode; and a color-changing layer that is interposed between the first electrode and the second electrode and includes an electrochromic material, wherein at least one of the first electrode and the second electrode includes the plurality of electrode patterns extending in one direction spaced apart from each other on the substrate.

5. The light path control device of claim 4, wherein the color-changing layer and the second electrode have the same shape as a shape of the first electrode and are disposed overlapping the first electrode.

6. The light path control device of claim 4, wherein at least one of the first electrode and the second electrode is formed in a form of a surface electrode on the substrate.

7. The light path control device of claim 4, wherein the first electrode, the color-changing layer, and the second electrode are formed widely from a central area to an edge area, and the first electrode and the second electrode are configured to receive voltage at the edge area.

8. The light path control device of claim 4, wherein the first electrode is formed widely from a central area to an edge area, and wherein the color-changing layer and the second electrode are formed only in the central area, so that the first electrode is exposed upward in the edge area on at least one side.

9. The light path control device of claim 1, wherein each of the plurality of lenses includes a semi-cylindrical or spherical lens.

10. The light path control device of claim 1, wherein each of the plurality of lenses is aligned at intervals between the light-shielding patterns.

11. The light path control device of claim 1, wherein the edge area is formed only between the central area and the at least one first side.

12. The light path control device of claim 1, wherein the electrode patterns are configured to be electrically connected to an external voltage source in the edge area adjacent to the at least one first side.

13. A display device, comprising:

a display panel that displays an image through a display area in which pixels are arranged and non-display area surrounding the display area; and a light path control device that is controlled to operate in a light-transmitting mode or a light-shielding mode in response to a share mode or private mode of the display panel, wherein the light path control device comprises:

a substrate;

a viewing angle control member including light-shielding patterns patterned on the substrate at regular intervals; and a lens assembly that is formed on the viewing angle control member and includes a plurality of lenses, wherein the light-shielding patterns include electrochromic elements to implement a light-shielding mode or a light-transmitting mode, the electrochromic elements comprise a plurality of electrode patterns spaced apart from each other, wherein the substrate has a plurality of sides, wherein the electrode patterns are connected to each other in the non-display area adjacent to at least one first side of the plurality of sides, and wherein a first distance between the display area and the at least one first side is greater than a second distance between the display area and at least one second side, different from the at least one first side, of the plurality of sides.

14. The display device of claim 13, further comprising a backlight unit that is disposed under the light path control device and emits light, wherein the display panel is a liquid crystal display disposed on an upper portion of the light path control device.

15. The display device of claim 14, wherein an air gap is formed between the light path control device and the display panel.

16. The display device of claim 14, further comprising a lens cover layer that has a refractive index lower than that of the plurality of lenses and covers the plurality of lenses.

17. The display device of claim 16, wherein the light path control device and the display panel are in direct contact with each other.

18. The display device of claim 13, further comprising a backlight unit that is disposed under the light path control device and emits light, wherein the display panel is a liquid crystal display interposed between the light path control device and the backlight unit.

19. The display device of claim 13, wherein the display panel is an organic light emitting diode display panel disposed under the light path control device.

* * * * *